(12) United States Patent
Yu et al.

(10) Patent No.: US 10,420,244 B2
(45) Date of Patent: Sep. 17, 2019

(54) MOUNTING APPARATUS FOR EXPANSION CARDS, CASING, AND ELECTRONIC DEVICE USING THE SAME

(71) Applicant: HONGFUJIN PRECISION ELECTRONICS (TIANJIN) CO., LTD., Tianjin (CN)

(72) Inventors: Mo-Ming Yu, Tianjin (CN); Hong-Ming Wang, Tianjin (CN); Xi-Xi Wu, Tianjin (CN)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 0 days.

(21) Appl. No.: 16/015,494

(22) Filed: Jun. 22, 2018

(65) Prior Publication Data

US 2019/0254189 A1 Aug. 15, 2019

(30) Foreign Application Priority Data

Feb. 12, 2018 (CN) .......................... 2018 1 0151120

(51) Int. Cl.
*H05K 7/14* (2006.01)

(52) U.S. Cl.
CPC ......... *H05K 7/1417* (2013.01); *H05K 7/1407* (2013.01)

(58) Field of Classification Search
CPC ........................... H05K 7/1417; H05K 7/1407
See application file for complete search history.

(56) References Cited

U.S. PATENT DOCUMENTS

| | | | |
|---|---|---|---|
| 6,215,668 B1* | 4/2001 | Hass | G06F 1/184 24/553 |
| 7,252,528 B1* | 8/2007 | Tsao | G06F 1/185 361/759 |
| 2004/0037048 A1* | 2/2004 | Liao | H05K 7/1408 361/726 |
| 2004/0120125 A1* | 6/2004 | Taylor | G06F 1/184 361/759 |
| 2004/0124752 A1* | 7/2004 | Wei | G06F 1/184 312/293.3 |
| 2005/0148228 A1* | 7/2005 | Jing | H05K 7/1408 439/325 |
| 2006/0007664 A1* | 1/2006 | Jing | G06F 1/184 361/801 |
| 2010/0134988 A1* | 6/2010 | Zheng | G06F 1/185 361/756 |
| 2013/0107478 A1* | 5/2013 | Zhou | G06F 1/186 361/759 |

(Continued)

*Primary Examiner* — Hoa C Nguyen
*Assistant Examiner* — Keith DePew
(74) *Attorney, Agent, or Firm* — ScienBiziP, P.C.

(57) ABSTRACT

A mounting apparatus for securely mounting one end of an expansion card to a chassis and a casing includes a locking bracket, a rotating member, and a fixing member which is connected to the locking bracket. The locking bracket includes a locking portion and a fixing portion. The locking bracket is rotatably connected to the chassis by the rotating member, and the locking portion is rotatable between a locking position and an unlocking position, where the fixing member releases the fixing portion and the locking portion separates from the end of the expansion card.

14 Claims, 6 Drawing Sheets

(56) References Cited

U.S. PATENT DOCUMENTS

| | | | |
|---|---|---|---|
| 2014/0022753 A1* | 1/2014 | Fu | G06F 1/186 361/807 |
| 2015/0048727 A1* | 2/2015 | Liu | H05K 7/1409 312/223.2 |
| 2016/0286678 A1* | 9/2016 | Venugopal | G06F 13/4068 |

* cited by examiner

200

MOUNTING APPARATUS FOR EXPANSION CARDS, CASING, AND ELECTRONIC DEVICE USING THE SAME

FIELD

The subject matter herein generally relates to mounting apparatuses.

BACKGROUND

PCI (Peripheral Component Interconnect) slots are provided on the motherboard of a computer or a server for installing expansion cards, which can be plugged into PCI slots. To prevent the loosening of the expansion card during moving or over lifetime use, the expansion card usually has a stopping plate on one side. The stopping plate can be fixed on the computer casing by screws, which needs tools to operate, and screws can be lost during the operation.

Thus, there is room for improvement within the art.

BRIEF DESCRIPTION OF THE DRAWINGS

Implementations of the present disclosure will now be described, by way of example only, with reference to the attached figures.

DETAILED DESCRIPTION

Figure 1:
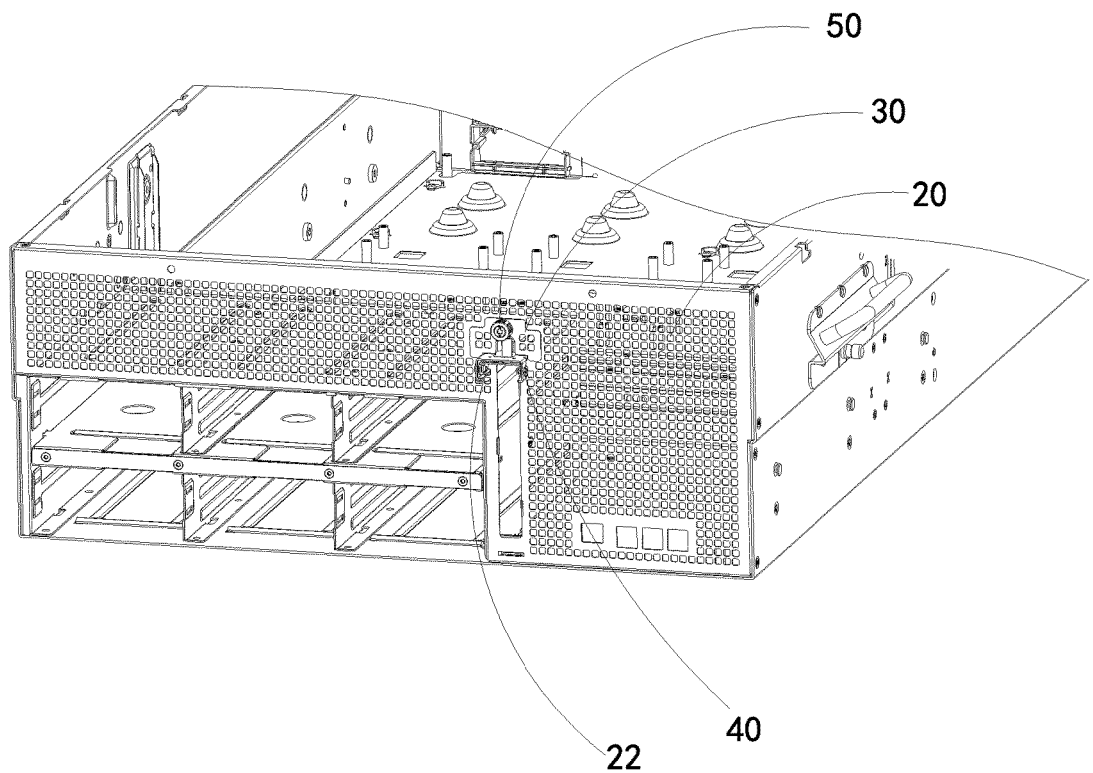
FIG. 1 illustrates an isometric view of an embodiment of a mounting apparatus.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "comprising" means "including, but not necessarily limited to"; it specifically indicates open-ended inclusion or membership in a so-described combination, group, series, and the like.

Figure 5:
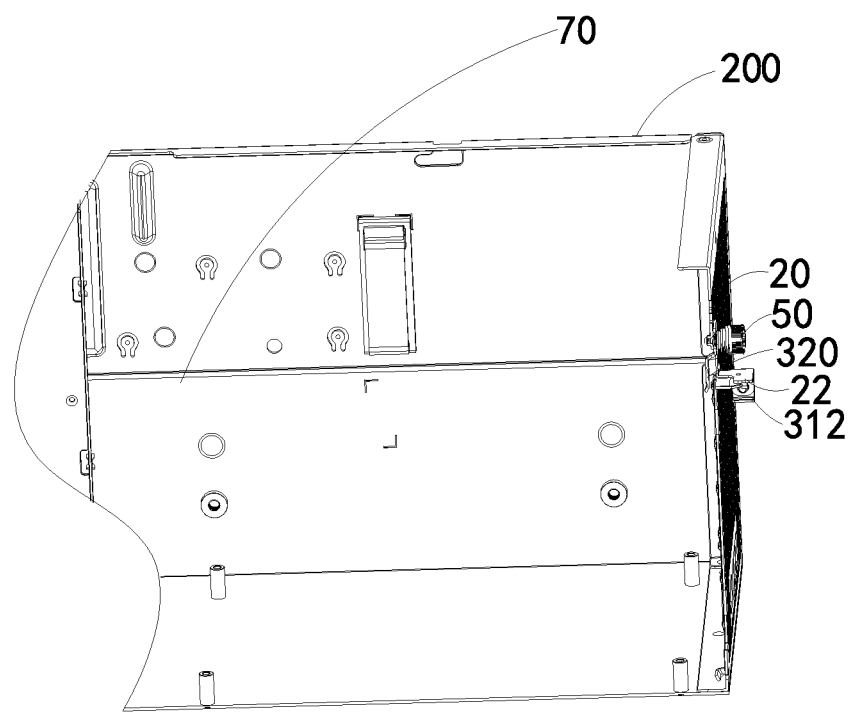
FIG. 5 illustrates a view of part of an electronic device.
Figure 6:
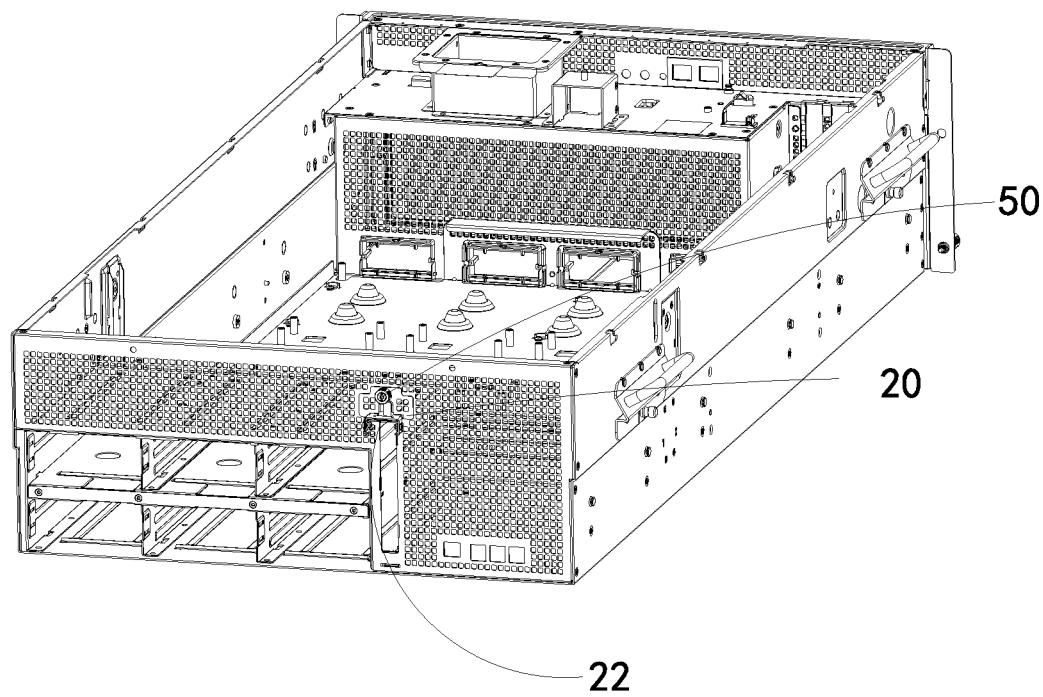
FIG. 6 illustrates an isometric view of an embodiment of a casing.

FIG. 5 illustrates an electronic device 500.

The electronic device 500 may include an expansion card 70 and a casing 200. The expansion card 70 is mounted to the casing 200.

Referring also to FIGS. 1-4 and 6, the casing 200 includes a chassis 60 and a mounting apparatus 100.

The mounting apparatus 100 is used to mount the expansion card 70 to the chassis 60. The mounting apparatus 100 can include a locking bracket 30, a rotating member 40 and a fixing member 50. The fixing member 50 is connected to the locking bracket 30.

The locking bracket 30 includes a locking portion 31 and a fixing portion 32. The locking portion 31 is used to lock the end of the expansion card 70.

Figure 2:
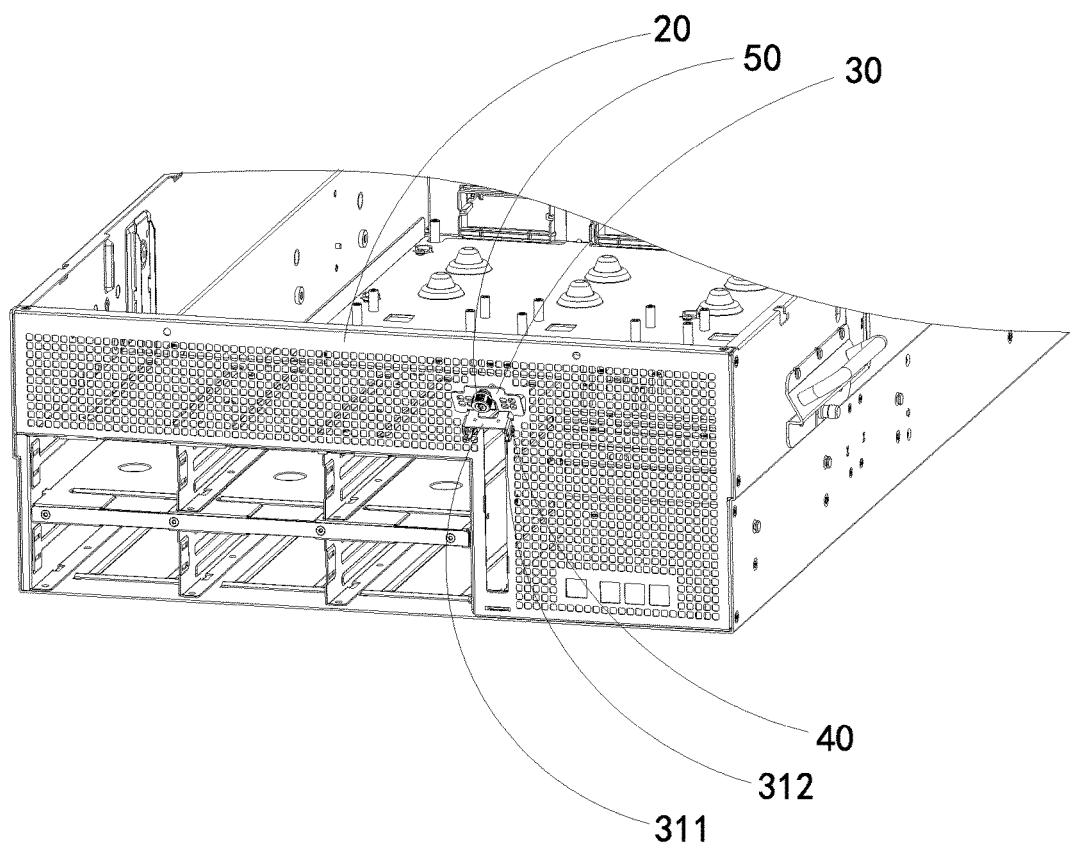
FIG. 2 illustrates another isometric view of the mounting apparatus of FIG. 1, showing the locking bracket in an unlocking position.
Figure 3:
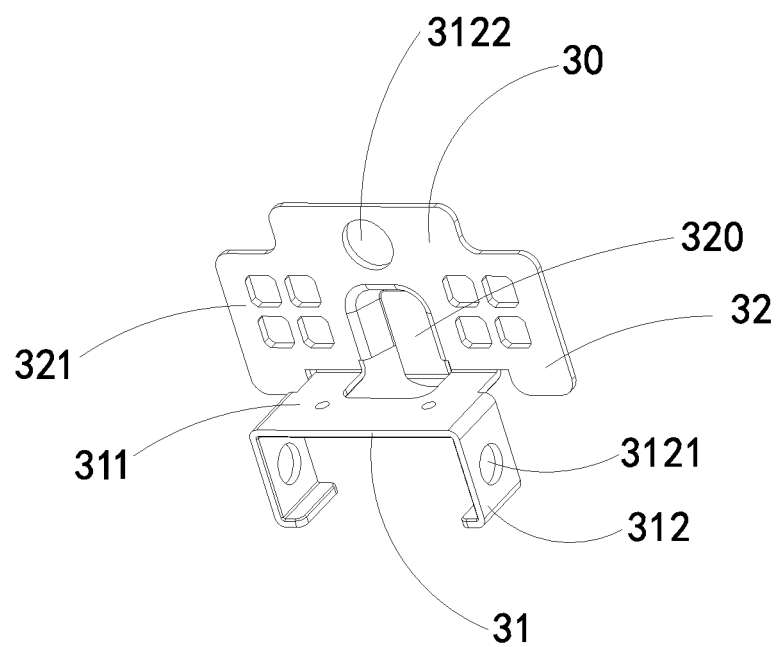
FIG. 3 illustrates an isometric view of the locking bracket of FIG. 2.
Figure 4:
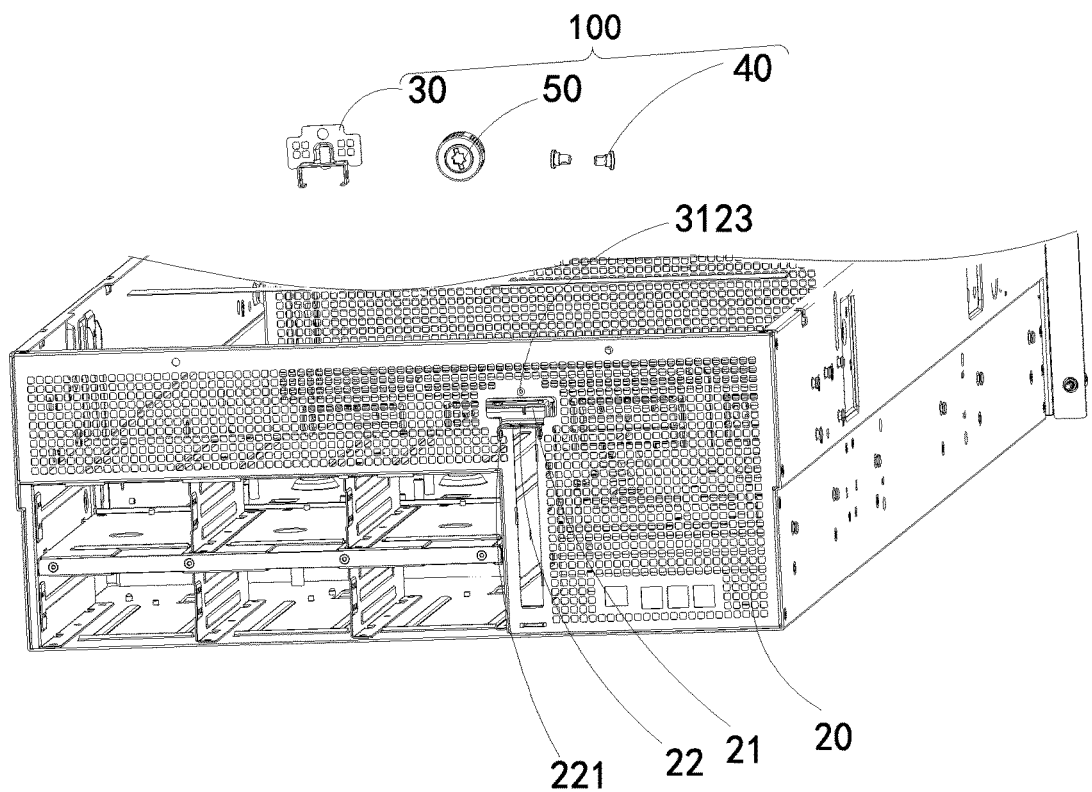
FIG. 4 illustrates an exploded view of the locking bracket of FIG. 2.

The locking bracket 30 is rotatably connected to the chassis 60 by the rotating member 40, and the locking portion 31 is rotatable between a locking position (as shown in FIG. 4) and an unlocking position (as shown in FIG. 2).

When the locking portion 31 is rotated to the locking position, the locking portion 31 latches the end of expansion card 70 and the fixing portion 32 is fixed to the chassis 60 by the fixing member 50. When the locking portion 31 is rotated to the unlocking position, the fixing member 50 releases the fixing portion 32 and the locking portion 31 separates from the end of expansion card 70.

The locking portion 31 can include a locking plate 311 and two first base plates 312. The two first base plates 312 are perpendicularly connected to a side of the locking plate 311, and the two first base plates 312 are adjacent to each other.

Each of the two first base plates 312 defines a first through hole 3121 corresponding to the rotating member 40. The locking bracket 30 is rotatably connected to the chassis 60 by the rotating member 40 and the first through holes 3121.

The fixing portion 32 includes a fixing plate 321, the fixing portion 32 is fixed to the chassis 60 by the fixing member 50 and the fixing plate 321.

The mounting apparatus 100 can further include an extending portion 22. The extending portion 22 is defined on the chassis 60 and corresponds to the locking portion 31. The extending portion 22 includes two second base plates 221 parallel and adjacent to each other.

The locking bracket 30 is rotatably connected to the two second base plates 221 by the rotating member 40 and the first through holes 3121.

Each of the two second base plates 221 defines a second through hole 2211 corresponding to the rotating member 40.

Each of the two second base plates 221 is aligned with one of the two first base plates 312. The rotating member 40 passes through the first through holes 312 and the second through holes 221 and the locking bracket 30 is rotatably connected to the chassis 60 by the two first base plates 312, the two second base plates 221, and the rotating member 40.

The mounting apparatus can further include a screw (not shown) movably mounted to an end of the fixing portion 32, a screw hole being defined on the chassis 60. The fixing plate 321 defines a third through hole 3122 corresponding to the screw hole.

The screw passes through the third through hole 3122 and connects to the screw hole to fix the fixing portion 32 to the chassis 60.

The chassis 60 includes a back plate 20 to which the second base plate 221 is perpendicularly connected.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A mounting apparatus for mounting an end of an expansion card to a chassis, comprising:
   a locking bracket comprising:
     a locking portion configured to lock the end of the expansion card; and
     a fixing portion comprising a fixing plate;
   a rotating member;
   a fixing member connected to the locking bracket; and
   a screw movably mounted to an end of the fixing portion;
   wherein the locking bracket is rotatably connected to the chassis by the rotating member, and the locking portion is rotatable between a locking position, where the locking portion latches the end of expansion card and the fixing portion is fixed to the chassis by the fixing member, and an unlocking position, where the fixing member releases the fixing portion and the locking portion separates from the end of expansion card;
   wherein the fixing portion is fixed to the chassis by the fixing member and the fixing plate; and
   wherein a screw hole defined on the chassis; the fixing plate defines a third through hole corresponding to the screw hole; the screw passes through the third through hole and connects to the screw hole to fix the fixing portion to the chassis.

2. The mounting apparatus of claim 1, wherein the locking portion comprises:
   a locking plate; and
   two first base plates perpendicularly connected to a side of the locking plate, wherein the two first base plates are adjacent to each other;
   wherein each of the two first base plates define a first through hole corresponding to the rotating member, the locking bracket is rotatably connected to the chassis by the rotating member and the first through holes.

3. The mounting apparatus of claim 2, wherein the mounting apparatus further comprises an extending portion defined on the chassis and corresponding to the locking portion, the extending portion comprises two second base plates that are parallel and adjacent to each other;
   wherein the locking bracket is rotatably connected to the two second base plates by the rotating member and the first through holes.

4. The mounting apparatus of claim 3, wherein each of the two second base plates define a second through hole corresponding to the rotating member;
   each of the two second base plates is aligned to one of the two first base plates, the rotating member passes through the first through holes and the second through holes and the locking bracket is rotatably connected to the chassis through the two first base plates, the two second base plates and the rotating member.

5. The mounting apparatus of claim 3, wherein the chassis comprises a back plate, the second base plate is perpendicularly connected to the back plate.

6. A casing comprising:
   a chassis; and
   a mounting apparatus for mounting an end of an expansion card to the chassis, comprising:
     locking bracket comprising:
       a locking portion configured to lock the end of the expansion card; and
       a fixing portion comprising a fixing plate;
     an rotating member;
     a fixing member connected to the locking bracket; and
     a screw movably mounted to an end of the fixing portion;
   wherein the locking bracket is rotatably connected to the chassis by the rotating member, and the locking portion is rotatable between a locking position, where the locking portion latches the end of expansion card and the fixing portion is fixed to the chassis by the fixing member, and an unlocking position, where the fixing member releases the fixing portion and the locking portion separates with the end of expansion card;
   wherein the fixing portion is fixed to the chassis by the fixing member and the fixing plate; and
   wherein a screw hole defined on the chassis; the fixing plate defines a third through hole corresponding to the screw hole; the screw passes through the third through hole and connects to the screw hole to fix the fixing portion to the chassis.

7. The casing of claim 6, wherein the locking portion comprises:
   a locking plate; and
   two first base plates perpendicularly connected to a side of the locking plate, wherein the two first base plates are adjacent to each other;
   wherein each of the two first base plates defines a first through hole corresponding to the rotating member, the locking bracket is rotatably connected to the chassis by the rotating member and the first through holes.

8. The casing of claim 7, wherein the mounting apparatus further comprises an extending portion defined on the chassis and corresponding to the locking portion, the extending portion comprises two second base plates parallel and adjacent to each other;
   wherein the locking bracket is rotatably connected to the two second base plates by the rotating member and the first through holes.

9. The casing of claim 8, wherein each of the two second base plates define a second through hole corresponding to the rotating member;
   each of the two second base plates is aligned to one of the two first base plates, the rotating member passes through the first through holes and the second through holes and the locking bracket is rotatably connected to the chassis through the two first base plates, the two second base plates and the rotating member.

10. The mounting apparatus of claim 8, wherein the chassis comprises a back plate, the second base plate is perpendicularly connected to the back plate.

11. An electronic device comprising:
   an expansion card; and
   a casing comprising:
     a chassis; and
     a mounting apparatus for mounting an end of the expansion card to the chassis, comprising:
       locking bracket comprising:
         a locking portion configured to lock the end of the expansion card; and
         a fixing portion comprising a fixing plate;
       a rotating member;
       a fixing member connected to the locking bracket; and
       a screw movably mounted to an end of the fixing portion;
     wherein the locking bracket is rotatably connected to the chassis by the rotating member, and the locking portion is rotatable between a locking position, where the locking portion latches the end of expansion card and the fixing portion is fixed to the chassis by the fixing member, and an unlocking position, where the fixing member releases the fixing portion and the locking portion separates with the end of expansion card;

wherein the fixing portion is fixed to the chassis by the fixing member and the fixing plate; and wherein a screw hole defined on the chassis; the fixing plate defines a third through hole corresponding to the screw hole; the screw passes through the third through hole and connects to the screw hole to fix the fixing portion to the chassis.

12. The electronic device of claim 11, wherein the locking portion comprises:

a locking plate; and two first base plates perpendicularly connected to a side of the locking plate, wherein the two first base plates are adjacent to each other;

wherein each of the two first base plates defines a first through hole corresponding to the rotating member, the locking bracket is rotatably connected to the chassis by the rotating member and the first through holes.

13. The electronic device of claim 12, wherein the mounting apparatus further comprises an extending portion defined on the chassis and corresponding to the locking portion, the extending portion comprises two second base plates parallel and adjacent to each other;

wherein the locking bracket is rotatably connected to the two second base plates by the rotating member and the first through holes.

14. The electronic device of claim 13, wherein each of the two second base plates defines a second through hole corresponding to the rotating member;

each of the two second base plates is aligned to one of the two first base plates, the rotating member passes through the first through holes and the second through holes and the locking bracket is rotatably connected to the chassis by the two first base plates, the two second base plates and the rotating member.

* * * * *